United States Patent
Kuo et al.

(10) Patent No.: US 10,234,503 B2
(45) Date of Patent: Mar. 19, 2019

(54) DEBUGGING METHOD EXECUTED VIA SCAN CHAIN FOR SCAN TEST AND RELATED CIRCUITRY SYSTEM

(71) Applicant: Realtek Semiconductor Corp., HsinChu (TW)

(72) Inventors: Chun-Yi Kuo, Taipei (TW); Ying-Yen Chen, Chiayi County (TW); Jih-Nung Lee, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 15/385,841

(22) Filed: Dec. 20, 2016

(65) Prior Publication Data

US 2017/0176522 A1 Jun. 22, 2017

Related U.S. Application Data

(60) Provisional application No. 62/270,542, filed on Dec. 21, 2015.

(30) Foreign Application Priority Data

Aug. 30, 2016 (TW) .............................. 105127807 A

(51) Int. Cl.
*G01R 31/317* (2006.01)
*G01R 31/3177* (2006.01)
*G01R 31/3185* (2006.01)
*G01R 31/28* (2006.01)

(52) U.S. Cl.
CPC ..... *G01R 31/3172* (2013.01); *G01R 31/3177* (2013.01); *G01R 31/31701* (2013.01); *G01R 31/31705* (2013.01); *G01R 31/31709* (2013.01); *G01R 31/31713* (2013.01); *G01R 31/318569* (2013.01)

(58) Field of Classification Search
CPC .......... G01R 31/3172; G01R 31/31701; G01R 31/31705; G01R 31/31709; G01R 31/31713; G01R 31/3177
See application file for complete search history.

(56) References Cited

U.S. PATENT DOCUMENTS

2002/0138801 A1* 9/2002 Wang ............... G01R 31/31704
714/729

FOREIGN PATENT DOCUMENTS

CN 101762783 A 6/2010

* cited by examiner

*Primary Examiner* — Samir W Rizk
(74) *Attorney, Agent, or Firm* — Winston Hsu

(57) ABSTRACT

A circuit debugging method includes: utilizing a debugging circuit to determine an operating status of a specific circuit to generate a result; utilizing a register located in a scan chain path to store the result, wherein the scan chain path is arranged for a scan test; and utilizing an output pad located in the scan chain path to output the result, wherein the result is arranged to be indicative of the operating status of the specific circuit.

10 Claims, 5 Drawing Sheets

… (US 10,234,503 B2)

DEBUGGING METHOD EXECUTED VIA SCAN CHAIN FOR SCAN TEST AND RELATED CIRCUITRY SYSTEM

CROSS REFERENCE TO RELATED APPLICATIONS

This application claims the benefit of U.S. provisional application No. 62/270,542 filed on Dec. 21, 2015 and incorporated herein by reference.

BACKGROUND OF THE INVENTION

1. Field of the Invention

The present invention relates to a debugging method, and more particularly, to a debugging method executed via a scan chain for a scan test, and circuitry system related thereto.

2. Description of the Prior Art

In integrated circuit (IC) testing, different methods for controlling the number of pads being used always present an issue due to the large amount of signal lines installed in a digital/analog IC. Another important area in the field of IC testing is debugging. A frequency signal generated by a phase locked loop (PLL) of the IC may deviate from what is desired and therefore needs to be observed. In prior art solutions, the frequency signal generated by the PLL is inputted into a frequency divider, and then outputted via a pad, allowing the user to observe the frequency signal and perform debugging. When a plurality of circuits having large amount of signal lines require debugging, a large number of pads will thus be required, thus increasing the manufacturing cost.

SUMMARY OF THE INVENTION

One of the objectives of the present invention is therefore to provide a debugging method executed via a scan chain for a scan test, and a circuitry system related thereto.

According to an embodiment of the present invention, a circuit debugging method is disclosed, wherein the method comprises: utilizing a debug circuit to determine an operating status of a specific circuit and generate a result; storing the result in a register located on a scan chain path, wherein the scan chain path is configured for executing a scan test; and outputting the result via an output pad on the scan chain path, wherein the result is indicative of the operating status of the specific circuit.

According to an embodiment of the present invention, a circuit debugging system is disclosed, wherein the system comprises: a specific circuit, a debug circuit, a register and an output pad. The debug circuit is arranged to determine an operating status of the specific circuit and generate a result; the register is arranged to store the result, wherein the register is located on a scan chain path configured for executing a scan test; and the output pad is configured for outputting the result, wherein the result is indicative of the operating status of the specific circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
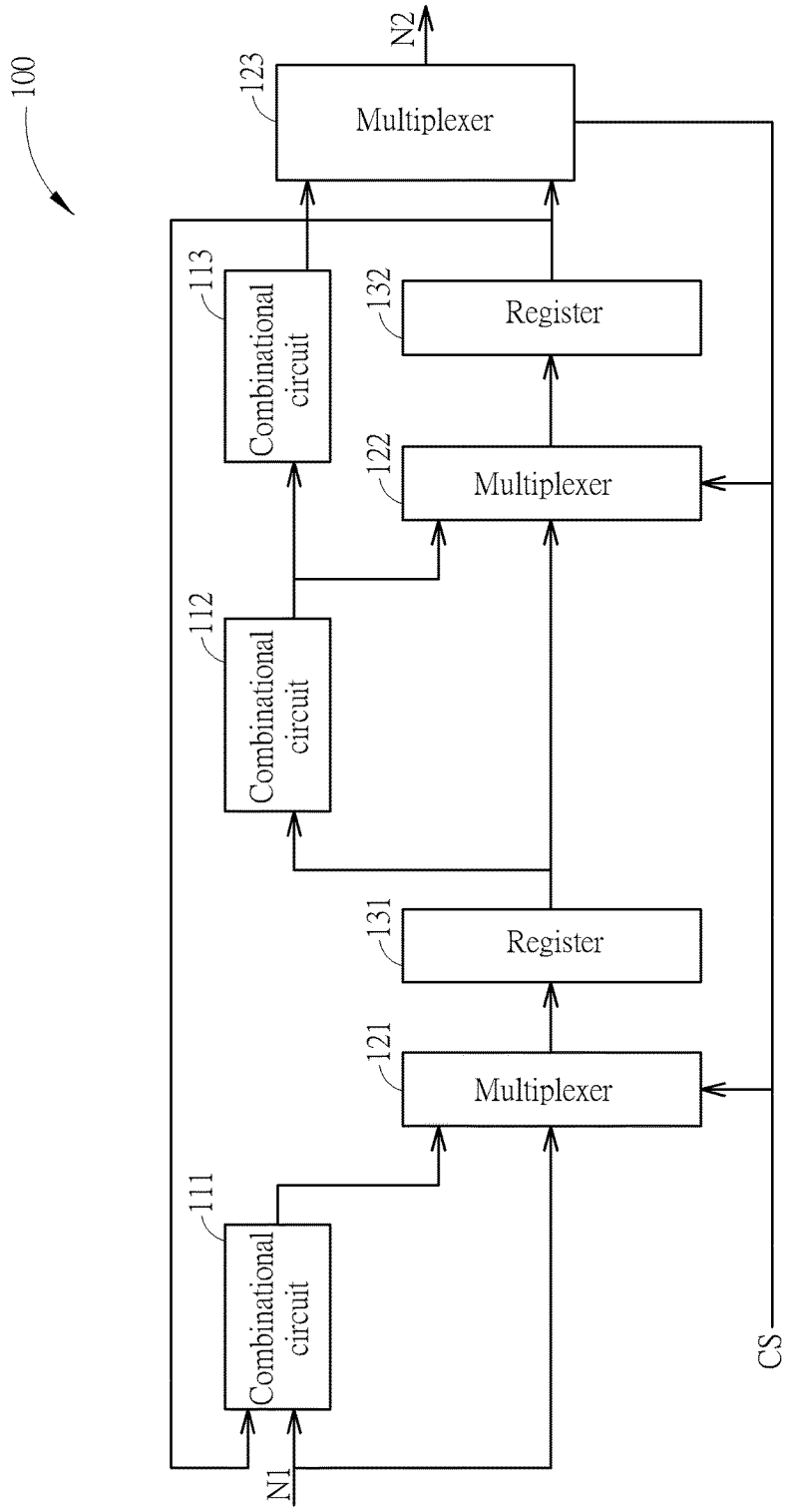
FIG. 1 is a diagram illustrating a scan test block according to the prior art.

FIG. 1 is a diagram illustrating a scan test block 100 according to the prior art. The scan test block 100 comprises combinational circuits 111, 112, and 113, multiplexers 121, 122 and 123, and registers 131 and 132, wherein the combinational circuits 111-113 and the registers 131 and 132 are not limited to any particular type of digital or analog circuit. For example, the registers 131 and 132 can be D flip-flop or T flip-flops. In addition, each arrow shown in FIG. 1 may represent more than one signal. For example, the combinational circuit 111 outputs two output signals to the multiplexer 121. Those skilled in the art of scan testing should readily understand the implementation of these circuits; the specification herein will focus on the debugging method which constitutes the present invention, and a description of the circuits in the scan test block 100 is omitted for brevity. Traditionally, a control signal CS controls the multiplexers 121, 122 and 123 to operate in a shift-in mode, a capture mode or a shift-out mode. When the multiplexers 121-123 operate in the shift-in mode, the multiplexers 121-123 and the registers 131-132 constitute a scan chain path. It should be noted that the scan test block 100 does not represent the whole scan test system. It might be only a part of the system, i.e. the combinational circuit 111 might couple to an output node N1 of another scan test block while the multiplexer 123 might couple to an input node N2 of yet another scan test block.

Figure 2:
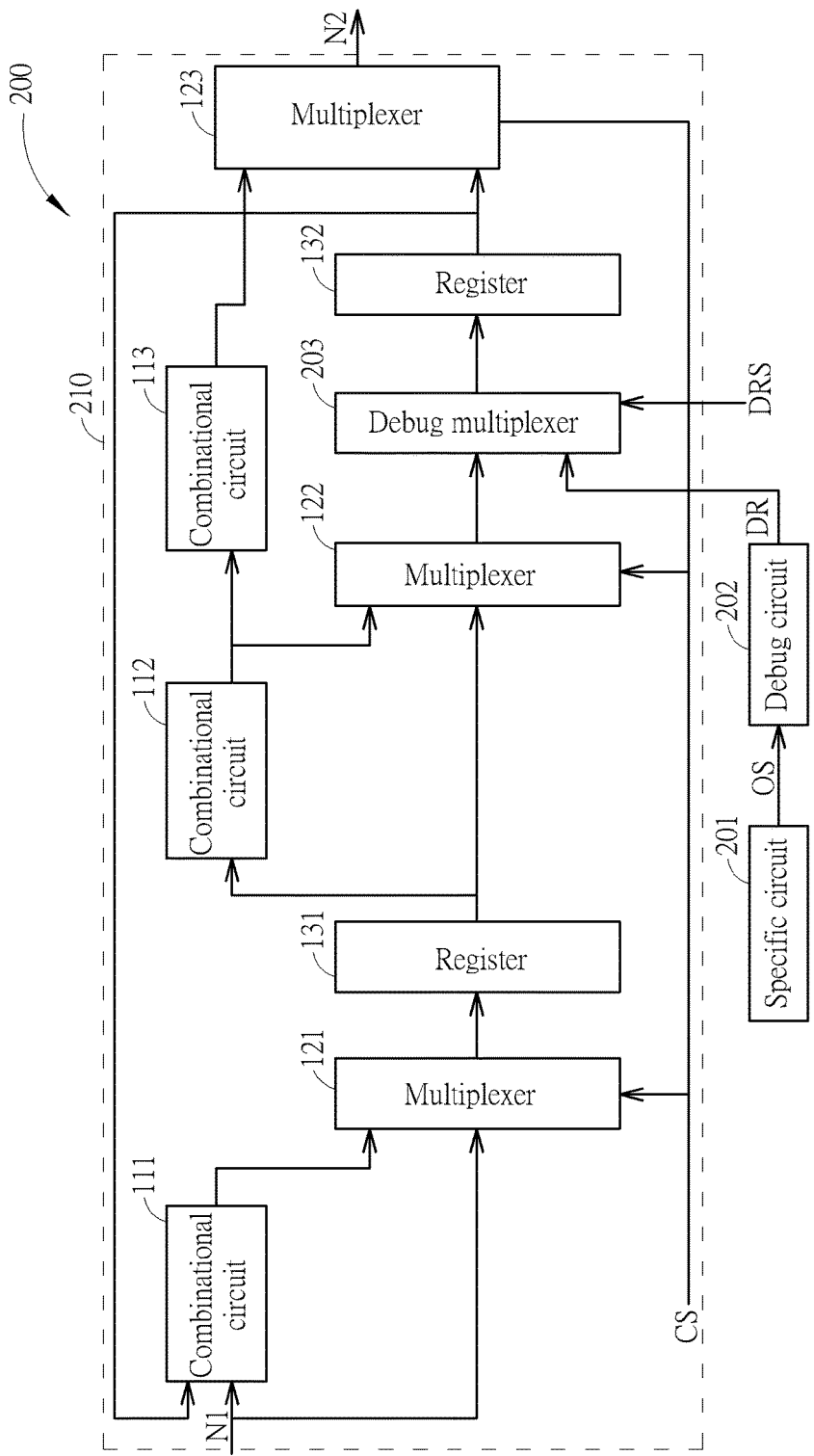
FIG. 2 is a diagram illustrating a circuit debugging system according to an embodiment of the present invention.

FIG. 2 is a diagram illustrating a circuit debugging system 200 according to an embodiment of the present invention. As shown in FIG. 2, the circuit debugging system includes a scan test block 210, a specific circuit 201 which requires debugging, and a debug circuit 202. The scan test block 210 further includes a debug multiplexer 203 in addition to those components of the scan test block 100 shown in FIG. 1. In this embodiment, the specific circuit 201 is a phase locked loop (PLL) circuit. In other embodiment, however, the specific circuit 201 can be a Static Random Access Memory (SRAM), a Low Dropout Linear regulator (LDO) or a flash memory; in other words, the type of specific circuit 201 is not a limitation of the present invention. The debug circuit 202 is configured to detect an operating status OS of the specific circuit 201 and generate a result DR. For example, when the specific circuit 201 is a PLL circuit, the operating status OS is a status of a frequency signal generated by the specific circuit 201, the debug circuit 202 receives and determines if the frequency signal fits a desired value, and generates the result DR. The result DR, in this case, is a logic value. If the result DR is the logic value '1', this may mean the frequency is correct; if the result DR is the logic value '0', this may mean the frequency is false.

In another example, the operating status OS is jitter signal of the PLL circuit, and the debug circuit 202 determines if the jitter signal is greater than a predetermined value after receiving the jitter information. If yes, the result DR may show the logic value '1'; otherwise, the result DR may show the logic value '0'. It should be noted that the result DR generated by the debug circuit 202 is not limited to be a logic value of one digit, and may comprise multiple digits. For example, the result DR can be '00', '01', '10' and '11', wherein each logic value represents a different operating status of the specific circuit 201, e.g. '00' means an error in the working period, '01' means an error of frequency, etc. These alternative designs all fall within the scope of the present invention. The debug multiplexer 203 is arranged to receive the result DR. In addition, the debug multiplexer 203 is controlled to operate in a debug mode by a debug control signal DRS. When operating in the debug mode, the debug multiplexer 203 stores the result DR into the register 132. Next, when the multiplexers 121-123 operate in the shift-out mode, the result DR is transmitted to the output pad (not shown in FIG. 2) from the register 132, allowing users to observe the result DR for debugging the specific circuit 201. It should be noted that when the debug multiplexer 203 does not operate in the debug mode, it operates with the multiplexers 121-123, so that the debug multiplexer 203 does not affect the normal operation of the scan test. When the multiplexers 121-123 operate in the shift-in mode, the debug multiplexer 203 also transmits the output signal of the multiplexer 122 to the register 132.

Figure 3:
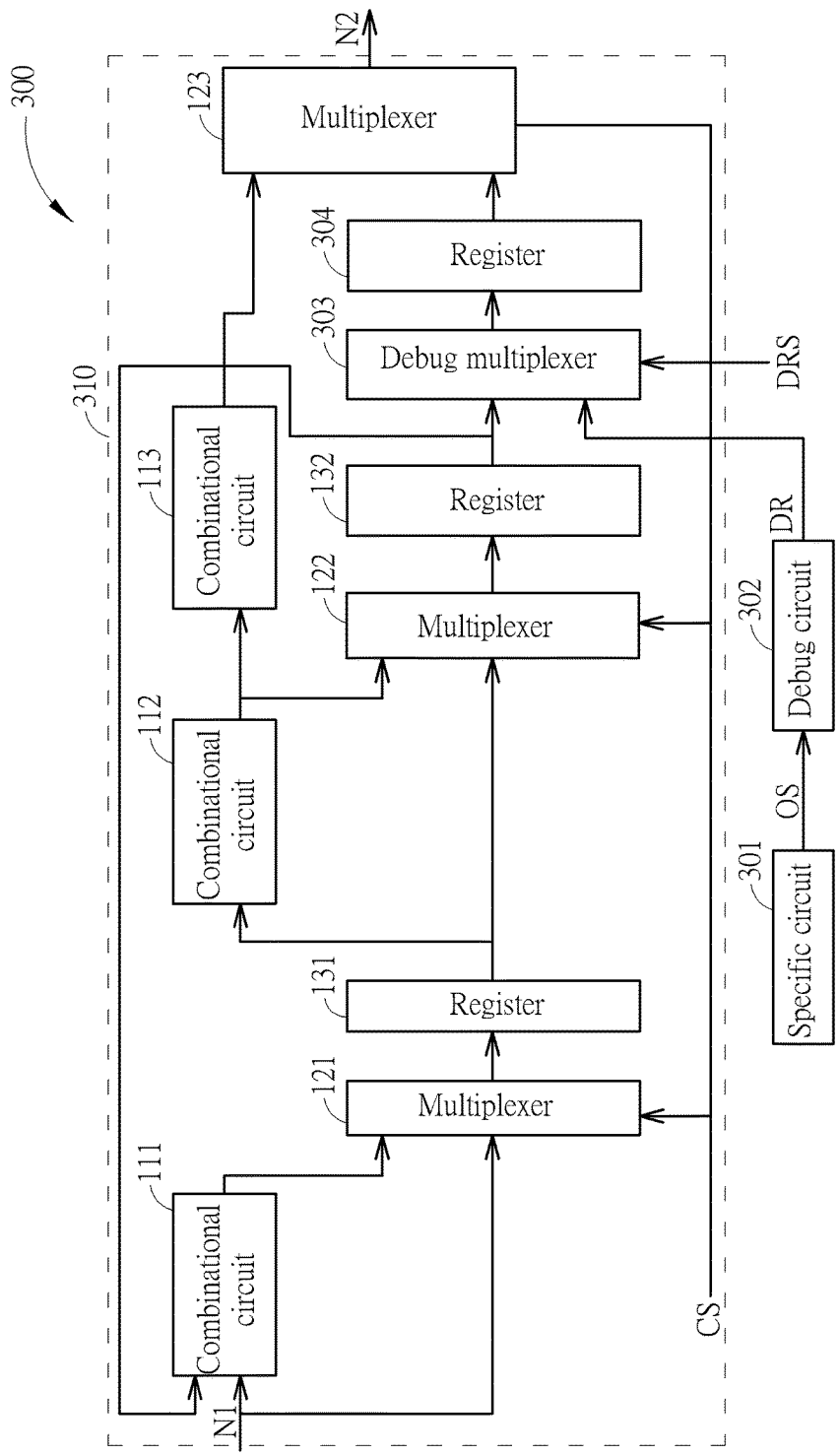
FIG. 3 is a diagram illustrating a circuit debugging system according to another embodiment of the present invention.

FIG. 3 is a diagram illustrating a circuit debugging system 300 according to another embodiment of the present invention. The circuit debugging system 300 comprises a scan test block 310, a specific circuit 301, and a debug circuit 302 The scan test block 310 further includes a debug multiplexer 303 and a register 304 as well as those components of the scan test block 100 shown in FIG. 1. The specific circuit 301, the functions of the debug circuit 302 and the debug multiplexer 303 are similar to those in the embodiment of FIG. 2, thus the detailed description is omitted here. The difference between FIG. 2 and FIG. 3 is that the scan chain path in FIG. 3 utilizes the debug multiplexer 303 and the register 304 for storing the result DR The debug multiplexer 303 and the register 304 are not an original part of the scan test system, i.e. the debug multiplexer 303 and the register 304 are only for storing and transmitting the result DR and will not affect the operation of any combinational circuit, as opposed to sharing a register on the scan chain path in the embodiment of FIG. 2. According to the description of the abovementioned embodiment, those skilled in the art should readily understand the operation of the embodiment shown in FIG. 3. Further detailed description is thus omitted here.

Figure 4:
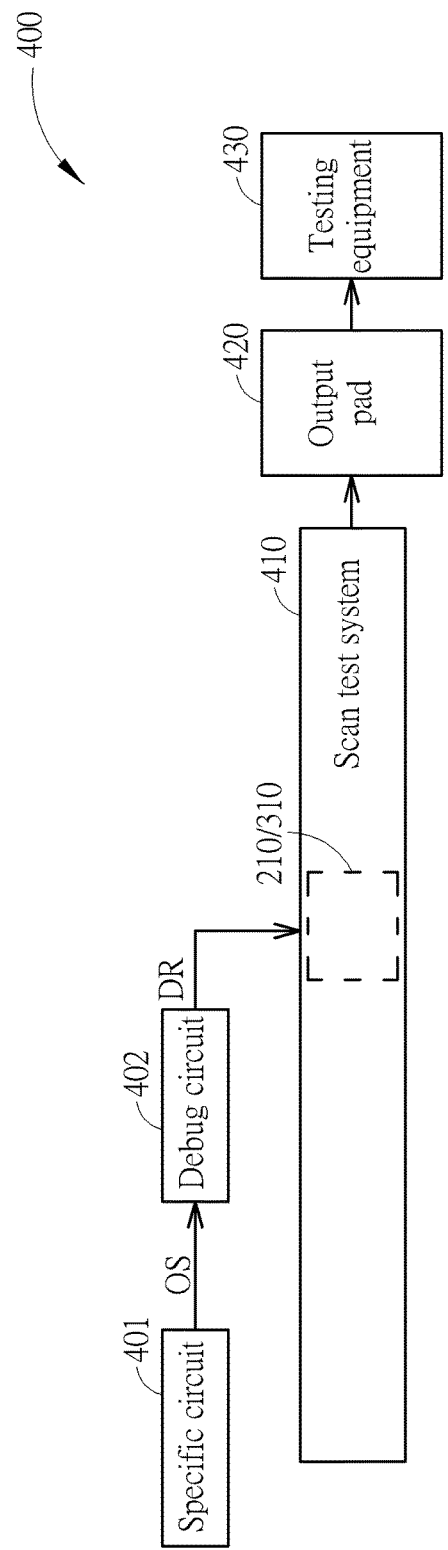
FIG. 4 is a diagram illustrating a testing environment applying a circuit debugging system according to an embodiment of the present invention.

FIG. 4 is a diagram illustrating a testing environment 400 applying a circuit debugging system according to an embodiment of the present invention. As shown in FIG. 4, the scan test system 410 may include a plurality of scan test blocks (shown by dotted lines), such as the scan test block 210 or 310. The debug circuit 402 determines the operating status OS of the specific circuit 401 and transmits the result DR to the debug multiplexer in the scan test block. In this embodiment, the debug multiplexer transmits the result DR to a dedicated register, e.g. the register 304 shown in FIG. 3, or to a register located on the original scan chain path, e.g. the register 132 shown in FIG. 2. The result DR is outputted to an output pad 420 coupled to a testing equipment 430 by the shift-out mode, allowing the user to observe the result DR using the testing equipment 430 and debug the specific circuit in the scan test block accordingly.

Figure 5:
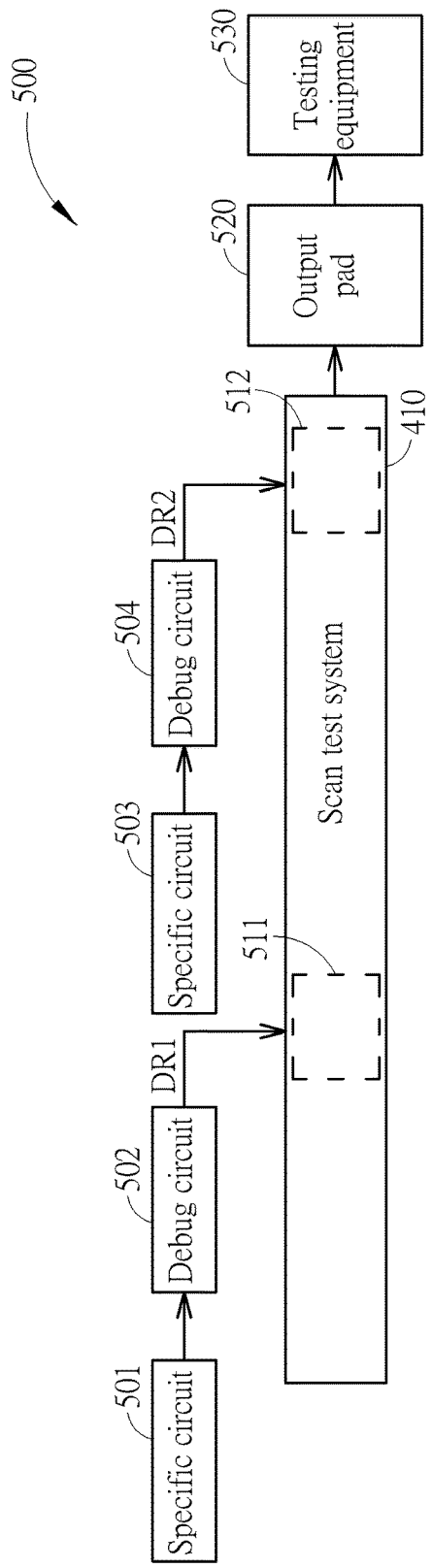
FIG. 5 is a diagram illustrating a testing environment applying a circuit debugging system according to another embodiment of the present invention.

It should be noted that a scan test system is not only for observing the operating status of one specific circuit. FIG. 5 is a diagram illustrating a testing environment 500 applying a circuit debugging system according to another embodiment of the present invention. As shown in FIG. 5, a scan test system 510 can observe the operating status of a plurality of specific circuits (specific circuits 501 and 503 in this embodiment), and the respective results DR1 and DR2 are transmitted to the scan test block 511 and 512, respectively, via the corresponding debug circuits (debug circuits 502 and 504 in this embodiment). The results DR1 and DR2 are then transmitted to an output pad 520 via the operation illustrated in the abovementioned embodiments, wherein the output pad 520 is coupled to a testing equipment 530. The user can observe the results DR1 and DR2 via the testing equipment 530 and debug the specific circuits 501 and 504 accordingly.

Briefly summarized, the present invention discloses a circuit debugging system and a circuit debugging method. By outputting the operating status of the specific circuit via the scan chain path for debugging the specific circuit, the testing and manufacturing cost can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A circuit debugging method, comprising:
utilizing a debug circuit to determine an operating status of a specific circuit and generate a result;
outputting the result to a first input of a debug multiplexer, wherein the debug multiplexer has a second input for receiving a control signal for controlling the debug multiplexer for operating in a debug mode, and the debug multiplexer is located on a scan chain path;
outputting the result from the debug multiplexer and storing the result in a register on the scan chain path; and
outputting the result via an output pad, wherein the result is indicative of the operating status of the specific circuit;
wherein the scan chain path is configured for executing a scan test when the debug multiplexer does not operate in the debug mode, and the debug circuit and the specific circuit are not located on the scan chain path.

2. The circuit debugging method of claim 1, further comprising:
controlling a multiplexer to enter a debug mode to store the result into the register, wherein an input of the multiplexer is coupled to the debug circuit.

3. The circuit debugging method of claim 1, wherein the specific circuit is a Phase Locked Loop (PLL).

4. The circuit debugging method of claim 3, wherein the operating status of the specific circuit is a frequency signal generated by the PLL, and the debug circuit generates the result according to the frequency signal to determine if the PLL operates correctly.

5. The circuit debugging method of claim 3, wherein the operating status of the specific circuit is a jitter signal generated by the PLL, and the debug circuit generates the result according to the jitter signal to determine if the PLL operates correctly.

6. The circuit debugging method of claim 1, wherein the specific circuit is a Static Random Access Memory (SRAM), a Low Dropout Linear Regulator (LDO) or a flash memory.

7. A circuit debugging system, comprising:
   a specific circuit;
   a debug circuit, arranged to determine an operating status of the specific circuit and generate a result;
   a debug multiplexer, arranged to receive the result from the debug circuit on a first input, and receive a control signal on a second input, wherein the control signal is for controlling the debug multiplexer to operate in a debug mode, and the debug multiplexer is located on a scan chain path;
   a register, arranged to receive the result from the debug multiplexer and store the result, wherein the register is located on the scan chain path; and
   an output pad configured for outputting the result, wherein the result is indicative of the operating status of the specific circuit;
   wherein the scan chain path is configured for executing a scan test when the debug multiplexer does not operate in the debug mode, and the debug circuit and the specific circuit are not located on the scan chain path.

8. The circuit debugging system of claim 7, further comprising:
   a multiplexer, wherein the multiplexer is controlled to enter a debug mode by a control signal, to store the result into the register, and an input of the multiplexer is coupled to the debug circuit.

9. The circuit debugging system of claim 7, wherein the specific circuit is a Phase Locked Loop (PLL).

10. The circuit debugging system of claim 9, wherein the operating status of the specific circuit is a frequency signal generated by the PLL, and the debug circuit generates the result according to the frequency signal to determine if the PLL operates correctly.

* * * * *